United States Patent [19]

Arakawa et al.

[11] Patent Number: 5,396,390
[45] Date of Patent: Mar. 7, 1995

[54] MAGNETIC HEAD ASSEMBLY FOR FLOPPY DISC DRIVE

[75] Inventors: Ken Arakawa; Atsushi Okamura; Ichiro Noguchi, all of Nagaoka, Japan

[73] Assignee: Alps Electric Co., Ltd., Tokyo, Japan

[21] Appl. No.: 203,210

[22] Filed: Aug. 28, 1994

[30] Foreign Application Priority Data

Mar. 12, 1993 [JP] Japan ................... 5-052371

[51] Int. Cl.⁶ .............................................. G11B 5/17
[52] U.S. Cl. ...................................... 360/123; 360/104
[58] Field of Search ....................... 360/123, 103–105

[56] References Cited

U.S. PATENT DOCUMENTS

| | | | |
|---|---|---|---|
| 4,710,833 | 12/1987 | Hasegawa | 360/105 |
| 4,788,613 | 11/1988 | Yamashita | 360/123 |
| 4,791,501 | 12/1988 | Kumakura et al. | 360/105 |
| 4,879,620 | 11/1989 | Yamashita | 360/123 |
| 5,311,400 | 5/1994 | Fuchs et al. | 360/104 X |

*Primary Examiner*—John H. Wolff
*Attorney, Agent, or Firm*—Guy W. Shoup; Patrick T. Bever

[57] ABSTRACT

A magnetic unit according to the present invention has a recess formed in a plate which is capable of accomodating terminals, FPC and conductive joining member, thus preventing the terminals, the conductive joining member, and the like from projecting out in the direction of thickness of a magnetic head, and consistently preventing short circuits in the terminal portion from occuring by preventing contact of the terminals and a base, as well as allowing thinner magnetic head units and FDDs to be produced. A ground circuit pattern portion formed on the FPC and the core are directly connected, such that even when a carriage having a gimbal plate mounted thereto is formed from a metal, no insulating sheets are required, which allows grounding of a magnetic core to be appropriately carried out at an electrical potential different from that of a chassis. In addition, no insulating members and the like are required, unlike conventional magnetic head units, thereby decreasing the number of parts to be used and allowing thinner magnetic head units to be produced. With the periphery of the FPC in a bent state, since the terminals and the circuit pattern can be connected, the occupying area can be decreased with respect to the gimbal plate of the FPC, allowing smaller gimbal plates and smaller magnetic head units to be produced.

3 Claims, 3 Drawing Sheets

MAGNETIC HEAD ASSEMBLY FOR FLOPPY DISC DRIVE

BACKGROUND OF THE INVENTION

The present invention relates to a magnetic head unit and, in particular, to a magnetic head unit which performs recording, reproducing, erasing, and the like of information on a recording medium such as a flexible disk.

Description of the Prior Art

In general, as a magnetic recording apparatus applied to a personal computer and the like, there has been frequently used a flexible disk drive (FDD) incorporating a magnetic head unit having a head carriage which serves as a head supporting member, and a cartridge mechanism containing a head arm which supports the magnetic head unit. The above-described magnetic head unit is formed by fixing a magnetic head which carries out recording, reproducing, erasing, and the like, of information on a recording medium such as a flexible disk (FD) to a head supporting member called a gimbal plate. The magnetic head is connected to a wiring member such as a flexible printed board (hereinafter referred to as FPC), allowing electrical connection to circuits.

FIGS. 5 and 6 each illustrates a conventional magnetic head unit incorporated in such an FDD. Magnetic head unit 1 is formed by fixing a magnetic head 2 to a gimbal plate 3, which serves as a head supporting member, the member being an elastic thin plate formed from a conductive metal such as aluminum and shaped into a specific shape, using adhesives or any other suitable joining member not illustrated in the figures.

The above-described magnetic head 2 has a slider (not illustrated), which is made of nonmagnetic material such as ceramic, fixed to the above-described gimbal plate 3. In this slider, a virtually U-shaped magnetic core 4a for recording and reproducing information, and a U-shaped magnetic core 4b for erasing information are each held so that their gaps are exposed with respect to the sliding surface of the magnetic recording medium. A coil bobbin 6 with a specified coil 5 wound around it is mounted to each of the above-described magnetic cores 4a and 4b. Each of both end portions thereof are connected to each of both end portions of the above-described magnetic cores 4a and 4b, and along with the above-described magnetic cores 4, a back core 7 comprising a closed magnetic circuit is fixed with a grip or any other fixing member not illustrated in the figures. A plurality of terminals 8, 8 . . . made of conductive materials is placed at the outside edge of the upper end surface of each of the above-described coil bobbins 6, 6, such that they pass right through and out of the above-described gimbal plate 3. The ends of each of the above-described coils 5 are connected to each of these terminals 8, 8.

An FPC 9 is provided on the surface opposite the surface of the above-described gimbal plate 3 to which the magnetic head 2 is fixed. The FPC 9 has as its substrate a base film 10. By means of a conductive ink and the like a desired circuit pattern 11 is formed on the surface opposite the facing surfaces of the gimbal plate 3 and the base film 10. At one end of the circuit pattern 11 formed on the FPC 9, there are provided holes 12 for connecting a predetermined number of terminals. The terminals 8 provided at the coil bobbins 6 of the above-described magnetic core 4 are inserted into the holes 12 for connecting the terminals, such that they project out of the FPC 9, and are electrically connected by a conductive joining member 13 which may be a solder. The other end of the above-described FPC 9 has connectors 14 electrically connected to the desired circuits (not illustrated).

The magnetic core 4 of the above-described magnetic head 2 is grounded with respect to the FPC 9 by means of the above-described gimbal plate 3.

Such a conventional magnetic head unit 1 is placed above the magnetic recording medium, which above-described magnetic head unit 1 (hereinafter called upper magnetic head unit 1) is mounted on the front end of the carriage (not illustrated) which is connected to a driving unit such as a stepping motor.

On the other hand, below the above-described upper magnetic head unit 1, there is placed a lower magnetic head unit in which the magnetic head is fixed to the plate so that the magnetic head faces the magnetic head 2 of the upper magnetic head unit 1. The lower magnetic head unit is, in the same way, mounted on a substrate (not illustrated) which is connected to a specified driving unit.

With a specified magnetic recording medium clamped by the above-described magnetic head 2 of the magnetic head unit 1 and the magnetic head of the lower magnetic head unit, driving the above-described magnetic recording medium as well as driving each of the above-described driving units to make the upper magnetic head 2 and the lower magnetic head scan the magnetic recording medium, allow recording, reading, erasing, and the like of a specified magnetic information on the magnetic recording medium to be carried out.

SUMMARY OF THE INVENTION

In recent years, with smaller, thinner, and higher performing FDDs and the like, it has also been necessary, in the same way, to make smaller and thinner magnetic heads capable of offering higher performance.

However, in the upper magnetic head unit 1 shown in FIG. 6 mentioned above, with the terminals 8 disposed in the coil bobbins 6 of the magnetic core 4 passed right through the holes 12 for connecting the terminals of the FPC 9, the above-described terminals 8 and the FPC 9 are connected with the conductive joining member 13, meaning that the front ends of the terminals 8 project out from the upper surface of the FPC 9. Consequently, the projected terminals 8 are obstacles to making the magnetic head unit 1 thinner. In addition, the terminals 8 are formed outside the coil bobbins 6, meaning that they are located at the outer boundary of the slider, so that the FPC 9 which corresponds to the terminals 8 needs to be large enough to be positioned outside of the slider. Accordingly, it is necessary to make the gimbal plate 3 of the fixing portion of the FPC 9 large, thus giving rise to the problem that the gimbal plate 3 cannot be made smaller.

In the lower magnetic head unit, the plate and the base to which this plate is mounted are formed from a metal, such as iron, so that a projected front end of the terminals causes a short-circuit thereof.

Further, the carriage to which the upper magnetic head unit 1 is mounted has been, conventionally, formed from plastic. With thinner FDDs in recent years, thinner carriages have been required. To produce thinner FDDs and to maintain the strength of the carriages, metals such as aluminum and iron have been used to make the carriages. In general, the chassis of the FDDs is also grounded, so that when the carriages are produced from metals, the gimbal plate 3, via the carriage, is also grounded at the same electrical potential as the chassis. For this reason, if the ground of the magnetic core 4 is connected to the FPC9 via the gimbal plate 3, the magnetic core 4 is grounded at an electrical potential different from the chassis with respect to the gimbal plate 3, so that the conventional ground means cannot be used as it is. Placing an insulating member such as an insulating sheet between the gimbal plate 3 and the carriage allows the magnetic core and the chassis to be grounded separately. However, the necessity of placing insulating members increases the number of parts, and is an obstacle to making thinner FDDs.

In view of the foregoing problems, the object of the present invention is to provide a thinner magnetic head unit capable of preventing short circuits of terminals, and allowing small gimbal plates to be used, as well as allowing suitable grounding of the magnetic core.

To achieve the above-described objects, according to a first aspect of the invention, there is provided a magnetic head unit having magnetic heads each containing a core with a gap at its tip, a coil being wound around each head, and each head being fixed respectively onto facing surfaces of a virtually tabular gimbal plate and a plate facing the gimbal plate; an FPC fixed respectively onto each of the surfaces opposite the facing surfaces of the gimbal plate and the plate to which is fixed the magnetic head; and terminals of the magnetic head electrically connected to a circuit pattern of the FPC, wherein a surface opposite the surface of the plate to which is fixed the magnetic head has a recess for accommodating the FPC.

To these ends, according to a second aspect of the present invention, there is also provided a magnetic head unit having magnetic heads each containing a core with a gap at its tip, a coil being wound around each head, and each head fixed respectively onto facing surfaces of a virtually tabular gimbal plate and a plate facing the gimbal plate; an FPC fixed respectively onto each of the surfaces opposite the surfaces of the gimbal plate and the plate to which is fixed the magnetic head; and terminals of the magnetic head electrically connected to a circuit pattern of the FPC, wherein a ground circuit pattern is formed on the FPC, and this ground circuit pattern portion and the core are directly connected.

To these ends, according to a third aspect of the present invention, there is further provided a magnetic head unit having magnetic heads each containing a core with a gap at its tip, a coil being wound around each head, and each head being fixed respectively onto facing surfaces of a virtually tabular gimbal plate and a plate facing the gimbal plate; an FPC fixed respectively onto each of the surfaces opposite the facing surfaces of the gimbal plate and the plate to which is fixed the magnetic head; and terminals of the magnetic head electrically connected to a circuit pattern of the FPC, wherein the magnetic head terminals fixed onto the gimbal plate is formed on the side surfaces of the magnetic head, and the periphery of the FPC is bent such that the circuit pattern passes right through the gimbal plate and is positioned in the terminal portion, with the terminals and the circuit pattern connected with each other.

According to the magnetic head unit in a first aspect of the present invention, the surface opposite the surface of the plate to which the magnetic head is fixed may be etched to form a recess portion for fitting the FPC and the conductive joining member, thereby preventing the front end of the terminals from projecting out from the lower side of the plate, as well as keeping the terminals and-the substrate from coming into contact with each other, which reliably prevents the occurrence of short circuits.

According to the magnetic head unit in a second aspect of the present invention, the ground circuit pattern portion formed on the FPC and the core are directly connected with each other, and since grounding is not carried out via a gimbal plate as it is conventionally done, insulating sheets do not have to be used, even when the carriage having a gimbal plate mounted thereto is formed from a metal, thereby allowing appropriate grounding of the magnetic core at an electrical potential different from that of the chassis.

According to the magnetic unit in still another aspect of the present invention, the terminals of the magnetic head fixed to the gimbal plate are formed on the side surface of the magnetic head, and the terminals and the circuit pattern are allowed to come into contact with each other, while the periphery of the FPC is bent such that the circuit pattern passes right through the gimbal plate and is positioned in the terminal portion. Accordingly, the occupying area with respect to the gimbal plate of the FPC can be reduced, thus allowing the production of smaller gimbal plates.

DESCRIPTION OF THE PREFERRED EMBODIMENT

The embodiments of the present invention will be described below with reference to FIGS. 1 through 3.

Figure 1:
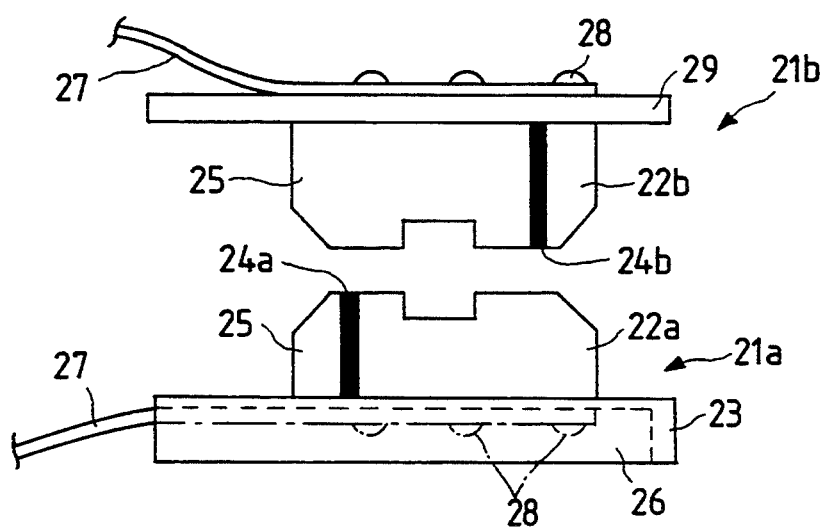
FIG. 1 is a front view illustrating one embodiment of a magnetic head unit according to a first aspect of the present invention.

FIG. 1 illustrates one embodiment of a magnetic head unit in accordance with a first aspect of the present invention. In the present embodiment, the lower magnetic head unit 21a is formed by directly fixing a magnetic head 22a with a suitable joining member such as an adhesive (not shown) to a plate 23 which serves as a head supporting member which is a thin plate formed into a specified shape from a conductive metal such as stainless steel and beryllium.

The above-described magnetic head 22a is formed by clamping both sides of the magnetic core 24a with a pair of sliders 25 made of nonmagnetic material such as ceramic, which core is fixed to the plate 23 by means of the slider 25. The plate 23 of the lower magnetic head unit 21a is mounted on a base (not shown) which is connected to a specific driving unit. The lower magnetic head unit 21a is operated by the linear plate method in which the above-described driving unit is driven to operate the magnetic head unit 21a via the above-described base.

A coil (not illustrated) is wound around the magnetic core 24a, and terminals (not shown) to which are connected the ends of the coil are provided for the magnetic head 22a such that they project out toward the plate 23.

Recess 26 of a predetermined depth is formed by etching and other such means on the surface opposite the surface of the plate 23 having the magnetic head 22a fixed thereto. The inside of the recess 26 is such as to accommodate an FPC27 which has a desired wiring pattern formed on one side of the base film. In addition, holes used to connect a predetermined number of terminals are provided at one end of the circuit pattern formed on the FPC27. The terminals of the coil bobbin of the magnetic core 24a are inserted and projected out of the holes used to connect the terminals, and are electrically connected with a conductive joining member 28 such as a solder.

The projected length of the conductive joining member 28 is, as shown in FIG. 1, less than the depth of the recess 26 of the plate 23.

On the other hand, the upper magnetic head unit 21b is formed by fixing a magnetic head 22b having the same structure as the above-described conventional magnetic head to a gimbal plate 29 with a suitable joining member such as an adhesive (not shown).

The dimensions of the portions of the lower magnetic head unit 21a illustrated in FIG. 1, may be set such that the magnetic head 22a is 2.4 mm high, the plate 23 is 0.4 mm thick, and the total thickness is 2.8 mm. The recess 26 can be made 0.3 mm deep, so that the thickness of the recess 26 of the plate 23 is 0.1 mm.

In the upper magnetic head unit 21b, the height of the magnetic head 22b is 2.7 mm, the thickness of the gimbal plate 29 is 0.1 mm, and the total thickness is 2.8 mm which is the same thickness as the lower magnetic head unit 21b.

Next, the operations of a first aspect of the present invention are described.

In the present embodiment, the recess 26 is formed in the plate 23, and since in the inside of the recess 26 the terminals of the magnetic head 22a and the FPC 27 can be connected with the conductive joining member 28, the terminals will not project out from the lower side of the plate 23.

In this case, in the present embodiment, the plate 23 becomes thicker than the conventional lower magnetic head unit 21a, but forming the slider 25 of the magnetic head 22a with a small thickness allows the lower magnetic head unit 21a to be formed with the same thickness as the conventional unit.

Accordingly, in the present embodiment, in the inside of the recess formed in the lower plate 23, the magnetic head 22a terminals can be connected to the FPC 27 with the conductive joining member 28, so that the end of the terminals does not project out from the lower side of the plate 23. Therefore, contact between the terminals and the substrate is prevented, thus preventing the occurrence of short circuits in the terminal portion.

Figure 2:
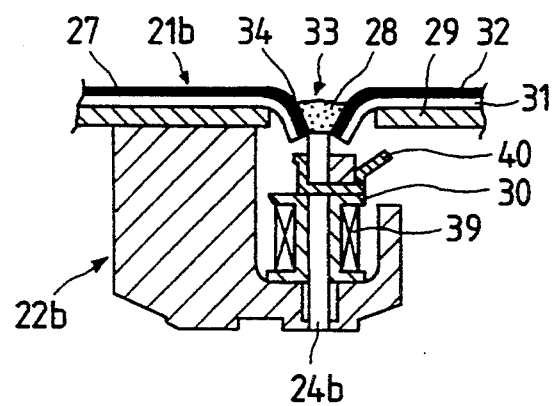
FIG. 2 is a longitudinal sectional view illustrating a portion of an embodiment of a second aspect of the present invention.

FIG. 2 illustrates an embodiment of a second aspect of the present invention. In the present embodiment, the magnetic head unit 21b is formed in the same way as it has been conventionally formed by fixing the magnetic head 22b to the gimbal plate 29.

The magnetic head 22b is formed by clamping both sides of the magnetic core 24b by means of a pair of sliders 25 formed from nonmagnetic material such as ceramic, and fixed to the gimbal plate 29 by means of the above-described slider 25. A coil bobbin 30, around which is wound a specified coil 39, and the like are mounted to the magnetic core 24b, and a back core 31 is fixed with a specified fixing member 40 (not illustrated) such as a grip to form a closed magnetic circuit. The coil bobbin 30 of the magnetic core 24 has terminals made of a desired quantity of conductive raw material which project out toward the gimbal plate 29. The ends of the coil 39 are connected to the terminals.

The FPC 27 having a specified circuit pattern 32 on one side of a base film 31 is mounted on the surface opposite the surface having the magnetic head 22b fixed to the gimbal plate 29, and a specified ground connecting section 33 is formed at the place which corresponds to the tip of the magnetic core 22 of the circuit pattern 32 of the FPC 27. A connecting hole 34 is punched into the ground connecting section 33, and the periphery of the connecting hole 34 is formed by swelling into an almost conical shape such that it is positioned as much as possible at the magnetic core 22b side.

With the tip of the magnetic core 22b inserted into the connecting hole 34 for connecting ground connecting section 33, filling the conductive joining member 28 into the swelled portion of the periphery of the connecting hole 34 allows connection of the magnetic core 22b and the ground connecting section 33.

Next, the operation of a second aspect of the invention will be described.

In the present embodiment, in punching connecting hole 34 into the ground connecting section 33 of the FPC, the periphery of this connecting hole 34 can be swelled at the same time. The FPC 27 formed in this way is mounted onto the gimbal plate 29 having the magnetic head 22b fixed thereto. With this condition, the tip of the magnetic core 24b of the magnetic head 22b is inserted, while the tip is in contact with the inside of the connecting hole 34 of the ground connecting section 33.

With this condition, filling the conductive joining member 28 into the swelled portion of the periphery of the connecting hole 34 allows electrical connection of the magnetic core 24b and the ground connecting section 33.

This allows the magnetic core 24b to be connected directly to the ground connecting section 33 of the FPC27, so that grounding is not carried out via the gimbal plate 29. Accordingly, even when the carrier mounted to the gimbal plate is formed from a metal, no insulating sheets are required, making possible suitable grounding of the magnetic core at an electrical potential different from that of the chassis.

Accordingly, in the present embodiment, direct grounding can be carried out with respect to the FPC27 without using the gimbal plate 29 by connecting the magnetic core 24b to the ground connecting section 33 of the FPC27, making it unnecessary to place the insulating sheets between the gimbal plate 29 and the carriage, as it has been conventionally done, thereby allowing appropriate grounding of the magnetic core 24b. Since the periphery of the connecting hole 34 of the ground connecting section 33 can be formed by swelling, at the magnetic core 24b side, to allow connection of the magnetic core 24b and the ground connecting section 33 in the swelled portion, the magnetic core 24b can be connected without projecting out from the upper surface of the FPC27. In addition, no insulating sheets are necessary, allowing thin magnetic head units to be produced.

Figure 3:
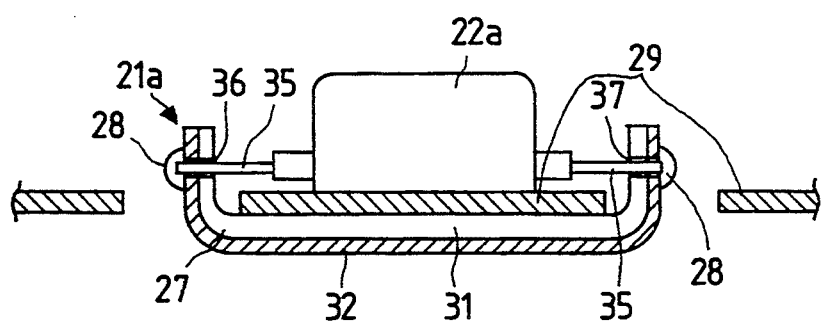
FIG. 3 is a longitudinal sectional view illustrating an embodiment of a third aspect of the present invention.
Figure 4:
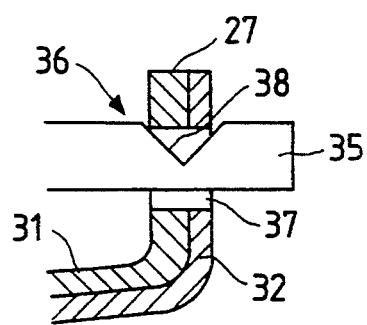
FIG. 4 is an enlarged front view illustrating the terminal portion of FIG. 3.
Figure 5:
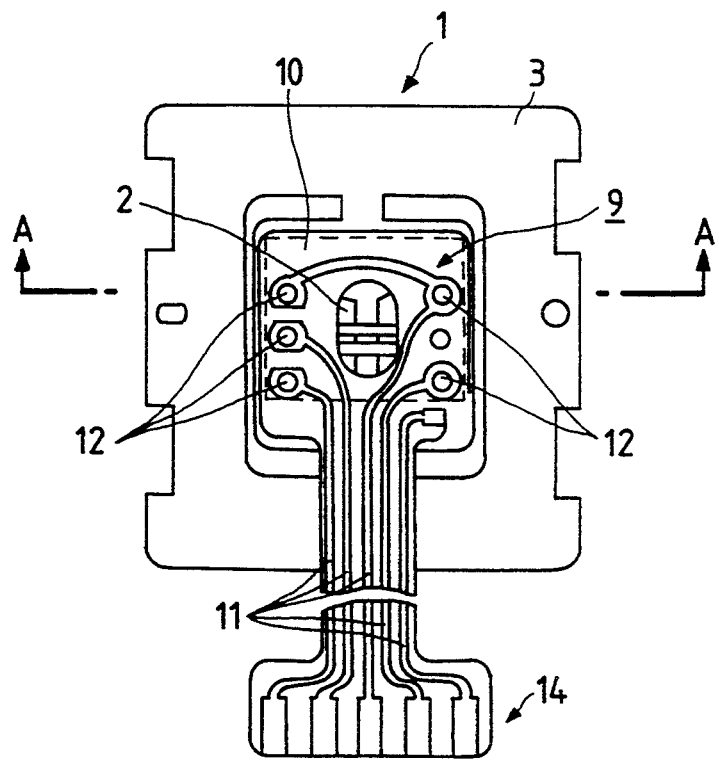
FIG. 5 is a front view illustrating a portion of a conventional magnetic head unit.
Figure 6:
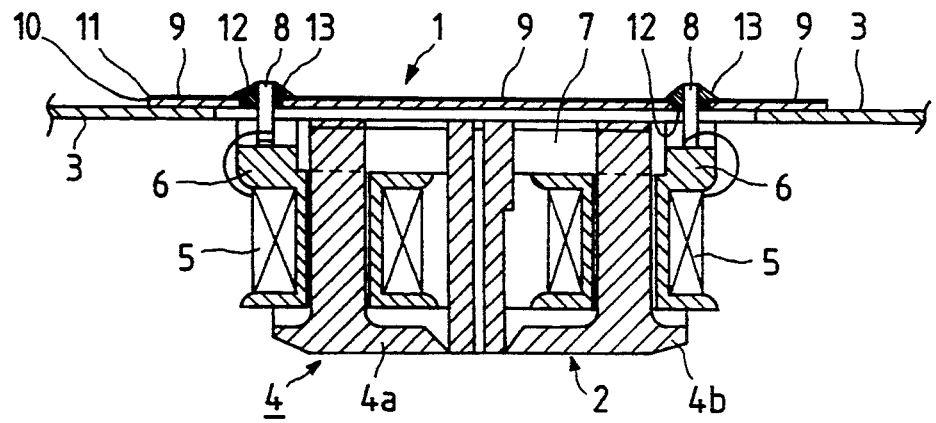
FIG. 6 is an enlarged cross section taken along the lines A—A.

FIG. 3 illustrates an embodiment of a third aspect of the present invention in which a magnetic head unit 21 of the present embodiment is formed by fixing a magnetic head 22 to a gimbal plate 29 as it has been conventionally done.

At the side surface adjacent to the gimbal plate 29 of the magnetic head 22, there are provided terminals 35 made of conductive raw material such that they project out parallel to the gimbal plate 29, and at the surface opposite the surface having the magnetic head 22 fixed to the gimbal plate 29, there is provided an FPC27.

In the present embodiment, a circuit pattern 32 is formed on the FPC27 such that the terminals joining section 36 is positioned at the periphery; and the periphery of the FPC27 is formed by passing it right through a gap made in the gimbal plate 29 and bending it toward the magnetic head side such that the terminal 22 joining section 36 is positioned at the terminal 35 portion of the magnetic head 22. In addition, engaging hole 37 is punched into the terminals joining section 36 of the FPC27, and an engaging notch 38 which engages with the engaging hole 37 is formed on the circumference of the terminal 35 of the magnetic head.

Next, the operation of a third aspect of the invention will be described.

In the present embodiment, after the magnetic head 22 and the FPC27 are respectively fixed onto the gimbal plate 29, the periphery of the FPC27 is passed through the gap of the gimbal plate 29 and bent toward the magnetic head 22 side, after which the engaging hole 37 of the terminal joining section 36 is engaged with the notch 38 for engaging the terminal 35 of the magnetic head 22, followed by temporarily fixing the FPC27 with respect to the FPC27. With this condition, connection of the terminal joining section 36 and the tip of the terminal 35 using the conductive joining member 28 allows the periphery of the FPC27 to be maintained in a bent state.

Accordingly, in the present embodiment, while the terminal 35 of the magnetic head 22 is projected out parallel to the gimbal plate 29, and the periphery of the FPC27 is in a bent state, the terminal joining section 36 and the terminal 35 can be connected, thus decreasing the occupying area with respect to the gimbal plate 29 of the FPC27, which allows a small gimbal plate 29 to be formed, allowing smaller magnetic head unit 21 as well as FDDs to be made.

In the above-described embodiment, while the terminal 35 and the terminal joining section 36 were connected by engaging the engaging notch 38 of the terminal 35 with the engaging hole 37, the terminal joining section 36 and the terminal 35 may also be connected by forming notch grooves in correspondence with the terminal 35 of the magnetic head 22 in the terminal joining section 36 of the FPC27 and pressing the notch groove of the terminal joining section 36 against the terminal 35 of the magnetic head 22 to position the section 36 and the terminal 35.

The present invention is not to be construed as limited to the above-described embodiments. Modifications thereof may be made when appropriate.

As described above, the magnetic unit according to the present invention has a recess formed in the plate which is capable of accommodating terminals, FPC and conductive joining member, thus preventing the terminals, conductive joining member, and the like from projecting out in the direction of thickness of the magnetic head, and consistently preventing short circuits in the terminal portion from occurring by preventing contact of the terminals and the base, as well as allowing thinner magnetic head units and FDDs to be made.

The ground circuit pattern portion formed on the FPC and the core are directly connected, such that even when the carriage having a gimbal plate mounted thereto is formed from a metal, no insulating sheets are required, which allows grounding of the magnetic core to be appropriately carried out at an electrical potential different from that of the chassis. In addition, no insulating members and the like are required, unlike conventional magnetic head units, thereby decreasing the number of parts to be used and allowing thinner magnetic head units to be produced.

With the periphery of the FPC in a bent state, since the terminals and the circuit pattern can be connected, the occupying area can be decreased with respect to the gimbal plate of the FPC, allowing small gimbal plates and smaller magnetic head units to be produced and the like.

What is claimed is:

1. A magnetic head unit having magnetic heads each consisting of a core with a gap at its tip, a coil being wound around each said head, and each said head being fixed respectively onto facing surfaces of a virtually tabular gimbal plate and a plate facing said gimbal plate; a flexible printed circuit fixed respectively onto each of the facing surfaces opposite the surfaces of said gimbal plate and said plate to which is fixed each of said magnetic heads; and terminals of said magnetic head electrically connected to a circuit pattern of said flexible printed circuit, wherein a surface opposite the surface of said plate to which is fixed the magnetic head has a recess for accommodating said flexible printed circuit, without connecting the core to the gimbal plate.

2. A magnetic head unit having magnetic heads each consisting of a core with a gap at its tip, a coil being wound around each said head, and each said head being fixed respectively onto facing surfaces of a virtually tabular gimbal plate and a plate facing said gimbal plate; a flexible printed circuit fixed respectively onto each of the facing surfaces opposite the surfaces of said gimbal plate and said plate to which is fixed said magnetic head; and terminals of said magnetic head electrically connected to a circuit pattern of said flexible printed circuit, wherein a ground circuit pattern is formed on said flexible printed circuit, and this ground circuit pattern portion and said core are directly connected, without connecting the core to the gimbal plate.

3. A magnetic head unit having magnetic heads each consisting of a core with a gap at its tip, a coil being wound around each said head, and each said head fixed respectively onto facing surfaces of a virtually tabular gimbal plate and a plate facing said gimbal plate; an flexible printed circuit fixed respectively onto each of the surfaces opposite the facing surfaces of said gimbal plate and said plate to which is fixed said magnetic head; and terminals of said magnetic head electrically connected to a circuit pattern of said flexible printed circuit, wherein the magnetic head terminals fixed onto said gimbal plate is formed on the surfaces of said magnetic head, and the periphery of said flexible printed circuit is bent such that the circuit pattern passes right through said gimbal plate and is positioned in said terminal portion, with said terminal and said circuit pattern connected with each other, without connecting the core to the gimbal plate.

* * * * *